(12) United States Patent
Xi et al.

(10) Patent No.: US 8,389,404 B2
(45) Date of Patent: Mar. 5, 2013

(54) SEMICONDUCTOR DEVICE AND METHOD FOR MANUFACTURING THE SAME

(75) Inventors: Minwei Xi, Shanghai (CN); Hong Zhu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 15 days.

(21) Appl. No.: 13/283,574

(22) Filed: Oct. 27, 2011

(65) Prior Publication Data

US 2012/0228761 A1 Sep. 13, 2012

(30) Foreign Application Priority Data

Mar. 7, 2011 (CN) .......................... 2011 1 0053783

(51) Int. Cl.
*H01L 21/44* (2006.01)
(52) U.S. Cl. .. 438/667; 438/458; 438/639; 257/E21.597
(58) Field of Classification Search .................. 257/737, 257/E21.568, E21.597, E23.068; 438/458, 438/613, 639, 667
See application file for complete search history.

(56) References Cited

U.S. PATENT DOCUMENTS

| | | | | |
|---|---|---|---|---|
| 7,015,128 | B1 * | 3/2006 | Chiang et al. ................. | 438/612 |
| 7,786,605 | B2 * | 8/2010 | Wood et al. .................... | 257/784 |
| 7,947,601 | B2 * | 5/2011 | Borthakur et al. ............. | 438/669 |
| 7,989,345 | B2 * | 8/2011 | Akram et al. ................. | 438/667 |
| 2012/0094443 | A1 * | 4/2012 | Pratt et al. ..................... | 438/121 |

FOREIGN PATENT DOCUMENTS

CN 101404279 A 4/2009

* cited by examiner

*Primary Examiner* — Tuan N. Quach
(74) *Attorney, Agent, or Firm* — Anova Law Group, PLLC

(57) ABSTRACT

A semiconductor device includes a first substrate and a second substrate being bonded to each other, a posterior interconnect layer interposed between the first and second substrates, a weld pad disposed in the posterior interconnect layer, and a first annular opening disposed in the first substrate. The device further includes a dielectric layer formed in the first opening, a via surrounded by the first annular opening, and an interconnect layer disposed in the via. The device also includes a conductive bump disposed on the interconnect layer and electrically connected to the weld pad through the interconnect layer.

10 Claims, 10 Drawing Sheets

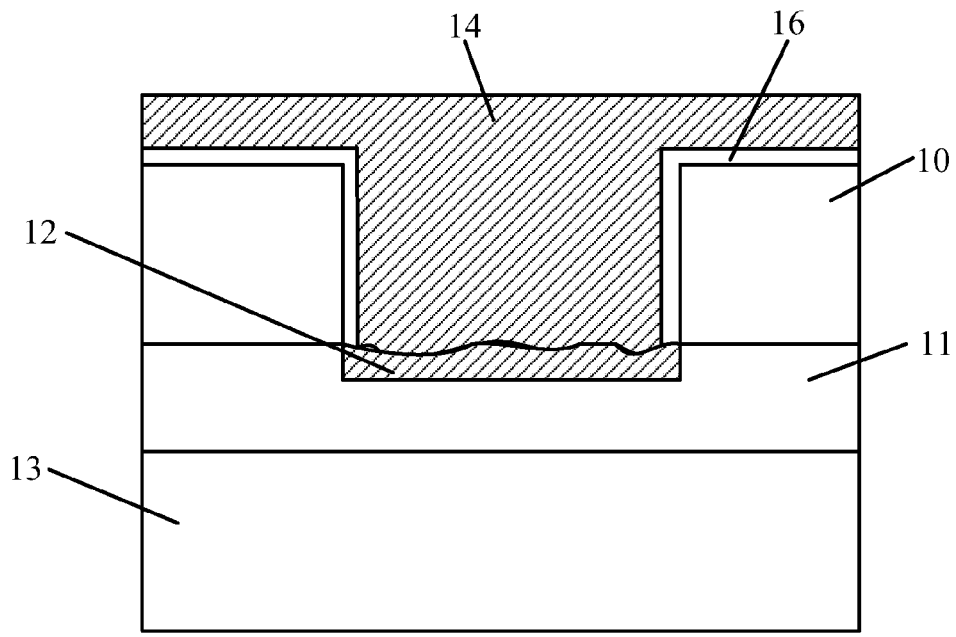
FIG. 3 *(prior art)*
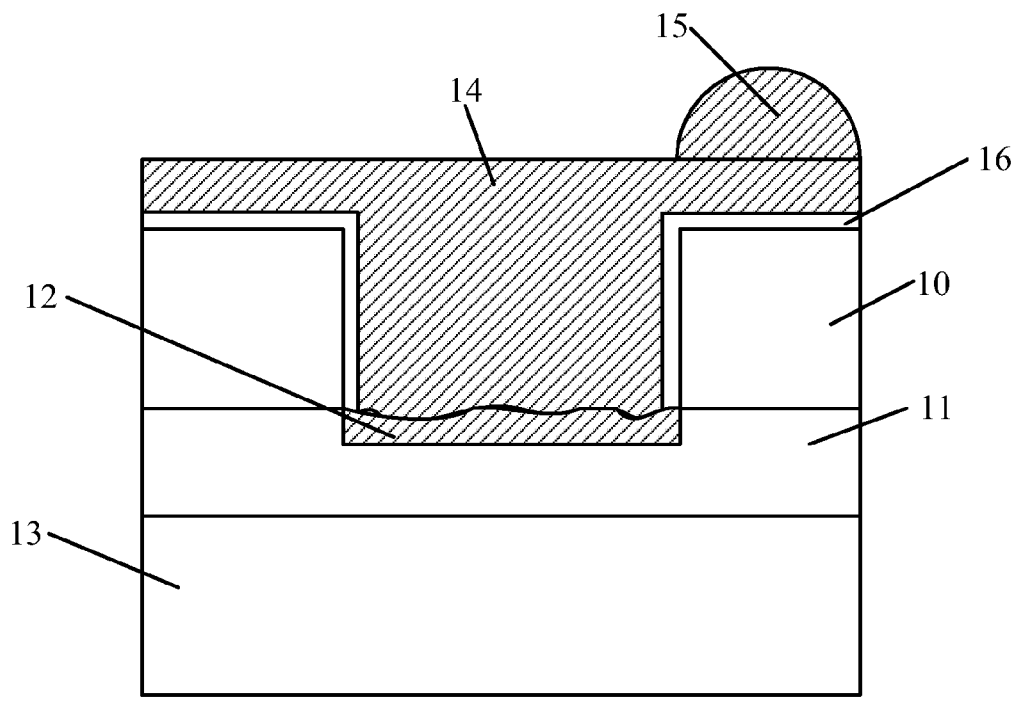
FIG. 4 *(prior art)*

SEMICONDUCTOR DEVICE AND METHOD FOR MANUFACTURING THE SAME

CROSS-REFERENCES TO RELATED APPLICATIONS

The present application claims the priority of Chinese Patent Application No. 201110053783.6, entitled "Semiconductor Device and Method for Manufacturing the same", and filed on Mar. 7, 2011, the entire disclosure of which is incorporated herein by reference.

FIELD OF THE INVENTION

The present invention relates to the semiconductor manufacturing field, and more particularly, to a semiconductor device and a method for manufacturing a semiconductor device having good reliability.

BACKGROUND OF THE INVENTION

With gradually scaling down of the critical dimensions of semiconductor devices to provide more functions within an effective area of semiconductor devices, 3D packaging techniques are developed. 3D packaging allows more semiconductor functions to be packed in a given volume. In 3D packaging, a PCB substrate and another substrate are welded together by soldered balls so that bonding wires are not needed, which allows significant size and weight reduction smaller and increase in operating speeds through improved communication between chips. In a prior art technique, semiconductor devices meeting process requirements are first produced, and they are then packaged together using a plastic packaging process or a ceramic packaging process.

FIG. 1 to FIG. 4 are schematic cross-sectional views of intermediate structures illustrating a method for manufacturing a semiconductor device, as known in the prior art. As shown in FIG. 1, a posterior interconnect layer 11 is formed on a surface of a first substrate 10. A weld pad 12 is formed in the posterior interconnect layer 11, then, a semiconductor component that is formed in the first substrate 10 are electrically connected with the weld pad 12.

Afterwards, the posterior interconnect layer 11 of the first substrate 10 is bonded with a second substrate 13 to form an original integral semiconductor device. A thinning process is performed on a surface of the first substrate 10 that is facing away from the second substrate 13 to obtain a desired thickness of the first substrate 10.

Thereafter, a plasma etching process is performed on the thinned surface of the first substrate 10 to form a via, as shown in FIG. 2.

Referring to FIG. 3, a dielectric layer 16 is formed on the surface of the first substrate and on sidewalls of the via. Then, the via is filled with an interconnect layer 14, which covers the dielectric layer 16.

Thereafter, referring to FIG. 4, a conductive bump 15 is formed and the conductive bump 15 is electrically connected with the interconnect layer 14.

Generally, after the conductive bump 15 is formed, a packaging process is performed. However, in the prior art, a semiconductor device thus formed has low reliability that affects the reliability of 3D packages of the semiconductor devices.

SUMMARY OF THE INVENTION

Embodiments of the present invention provide a semiconductor device and a method for manufacturing the semiconductor device. The method according to an embodiment of the present invention ensures that a interconnect layer is formed with good uniformity and a weld pad is formed without being damaged. Moreover, the method not only can enhance the reliability of semiconductor devices and 3D packages of the semiconductor devices, but also can simplify manufacturing processes, so that high production efficiency and production cost reduction can be achieved.

Embodiments or the present invention provides a semiconductor device that includes a first substrate and a second substrate that are bonded to each other. The device also includes a posterior interconnect layer that is interposed between the first substrate and the second substrate, a weld pad disposed in the posterior interconnect layer, and a first annular opening located in the first substrate or in the first substrate and the posterior interconnect layer, wherein the first annular opening exposes a portion of the weld pad. The device further includes a dielectric layer that fills the first opening, a via that is surrounded by the first annular opening, an interconnect layer formed in the via, and a conductive bump on the interconnect layer, wherein the conductive bump is electrically connected with the weld pad through the interconnect layer.

Optionally, the dielectric layer comprises an electric insulation material including silicon oxide or doped silicon oxide.

Optionally, the dielectric layer has a thickness ranging from 0.5 µm to 5 µm.

Optionally, the first opening has a width ranging from 0.1 µm to 50 µm.

Optionally, the weld pad is disposed in a portion of the posterior interconnect layer that is close to the first substrate.

Optionally, the weld pad is disposed in a portion of the posterior interconnect layer which is close to the second substrate.

In another embodiment, a method for manufacturing the semiconductor device includes providing a first substrate and a second substrate which are bonded to each other, wherein a posterior interconnect layer is formed between the first substrate and the second substrate and a weld pad is formed in the posterior interconnect layer. The method further includes forming a first annular opening in the first substrate or in the first substrate and the posterior interconnect layer to expose a portion of the weld pad, forming a dielectric layer in the first opening, and removing a portion of the first substrate that is surrounded by the first opening by performing a wet etching process and using the dielectric layer as a mask to form a via that expose at least a portion of the weld pad. The method also includes forming an interconnect layer in the via, and forming a conductive bump on the interconnect layer that is electrically connected with the weld pad through the interconnect layer.

Optionally, the wet etching process includes an etching selectivity ratio of the first substrate to the dielectric layer that is greater than 10:1. Optionally, the wet etching process uses an acidic etching solution. In an embodiment, the etching solution is a mixture which includes hydrofluoric acid and nitric acid.

Optionally, the dielectric layer includes an electric insulation material which includes silicon oxide or doped silicon oxide.

Optionally, the dielectric layer has a thickness ranging from 0.5 µm to 5 µm.

Optionally, the first opening has a width ranging from 0.1 µm to 50 µm.

Optionally, before the first opening is formed, the method includes performing a thinning process on a surface of the first substrate which is facing away from the second substrate, and after the thinning process, the first substrate may have a thickness ranging from 2 μm to 300 μm.

Optionally, the weld pad is located in a portion of the posterior interconnect layer which is close to the first substrate and the first annular opening is formed by etching of the first substrate.

Optionally, the weld pad is located in a portion of the posterior interconnect layer which is close to the second substrate and the first annular opening is formed by etching of the first substrate and a portion of the posterior interconnect layer.

Optionally, the dielectric layer is formed on the surface of the first substrate and a method for forming the interconnect layer further includes etching a portion of the dielectric layer which is near one side of the via to form a second opening in the dielectric layer, wherein the second opening is connected with the via, and filling a metallic material into the second opening and the via to form the interconnect layer, wherein the interconnect layer is flush with the other portion of the dielectric layer which is on the opposite side of the via.

Compared with prior art, embodiments the present invention provide the following advantages and benefits.

A first annular opening is formed in a first substrate or in a first substrate and a posterior interconnect layer to expose at least a portion of a weld pad, then a dielectric layer is formed in the first opening. Thereafter, a wet etching process is performed to remove a portion of the first substrate to form a via using the dielectric layer as a mask, wherein the portion of first substrate is surrounded by the first opening and the weld pad is exposed through the via. Therefore, compared with a plasma etching process which is adopted to etch the first substrate for forming the via in the prior art, a wet etching process in the embodiment of the present invention causes less damage to the weld pad. Uniformity of the via can be enhanced and stability of manufacturing processes can be improved. Furthermore, uniformity of the interconnect layer is also enhanced and the weld pad suffers fewer damages so that semiconductor devices thus formed show improved reliability and 3D packages of the semiconductor devices also have better reliability. Therefore, the present invention improves production efficiency and reduces production costs.

BRIEF DESCRIPTION OF THE DRAWINGS

FIG. 1 to FIG. 4 are schematic cross-sectional views of intermediate structures illustrating a method for manufacturing a semiconductor device, as known in the prior art;

DETAILED DESCRIPTION OF THE EMBODIMENTS

Semiconductor devices manufactured by a conventional manufacturing technology may have low reliability, which may affect the reliability of chips formed by packaging the semiconductor devices. Inventors of the present invention found that damage to a weld pad during the manufacturing process may affect the reliability of a semiconductor device.

Figure 1:
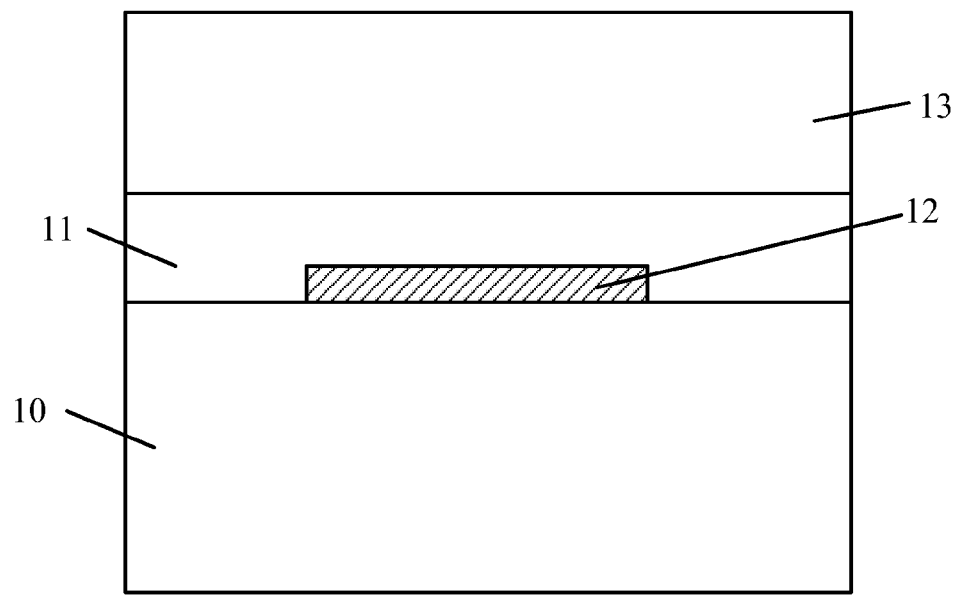
Figure 2:
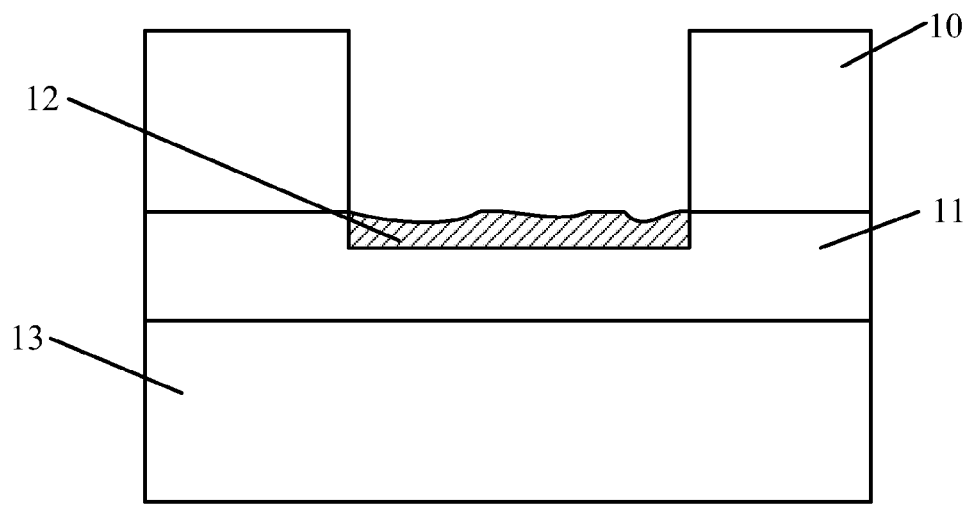

Specifically, in a prior art technique, a plasma etching process is adopted to etch a first substrate 10 for forming a via. In the plasma etching process, because the etching speed is not uniform and the via is required to be deep, time spent on the etching process is long and it is difficult to control a profile of the via and uniformity of the process, which may cause potential damage to a weld pad 12, as shown in FIG. 2, or incomplete removal of a portion of the first substrate that is located on the weld pad. Moreover, the plasma etching process is performed in a high intensity electric field, which may induce damage to a formed semiconductor device. Furthermore, inventors discovered that the profile of the via and the uniformity of the process cannot be improved by adjusting parameters of the plasma etching process.

Figure 5:
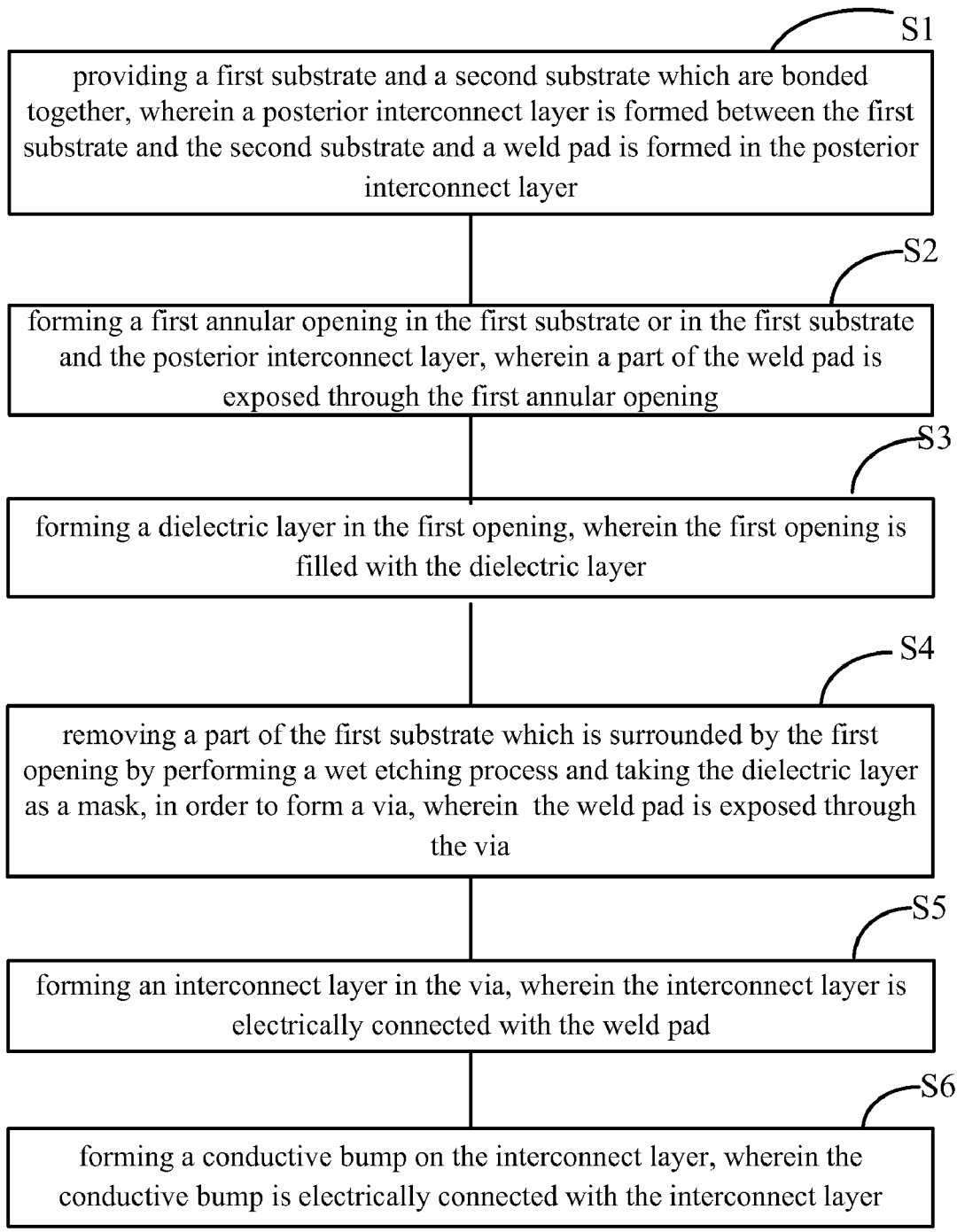
FIG. 5 is a flowchart diagram illustrating a method for manufacturing a semiconductor device according to an embodiment of the present invention.

To solve the problems mentioned above, an embodiment of the present invention provides a method for manufacturing a semiconductor device. Referring to FIG. 5 which is a flow chart illustrating a method for manufacturing a semiconductor device in an embodiment of the present invention, the method includes:

Step S1, providing a first substrate and a second substrate which are bonded together, wherein a posterior interconnect layer is formed between the first substrate and the second substrate and a weld pad is formed in the posterior interconnect layer;

Step S2, forming a first annular opening in the first substrate or in the first substrate and the posterior interconnect layer, wherein a portion of the weld pad is exposed through the first annular opening;

Step S3, forming a dielectric layer in the first opening, wherein the first opening is filled with the dielectric layer;

Step S4, removing a portion of the first substrate which is surrounded by the first opening by performing a wet etching process and taking the dielectric layer as a mask, in order to form a via, wherein the weld pad is exposed through the via;

Step S5, forming an interconnect layer in the via, wherein the interconnect layer is electrically connected with the weld pad; and Step S6, forming a conductive bump on the interconnect layer, wherein the conductive bump is electrically connected with the interconnect layer.

A technical solution provided by the present invention will be described in detail as follows according to embodiments of the present invention. FIG. 6 to FIG. 13 are referred hereinafter which are schematic cross-sectional views of intermediate structures illustrating a method for manufacturing a semiconductor device according to an embodiment of the present invention. Embodiment of the present invention will be described in detail with reference to the accompanying drawings.

Figure 6:
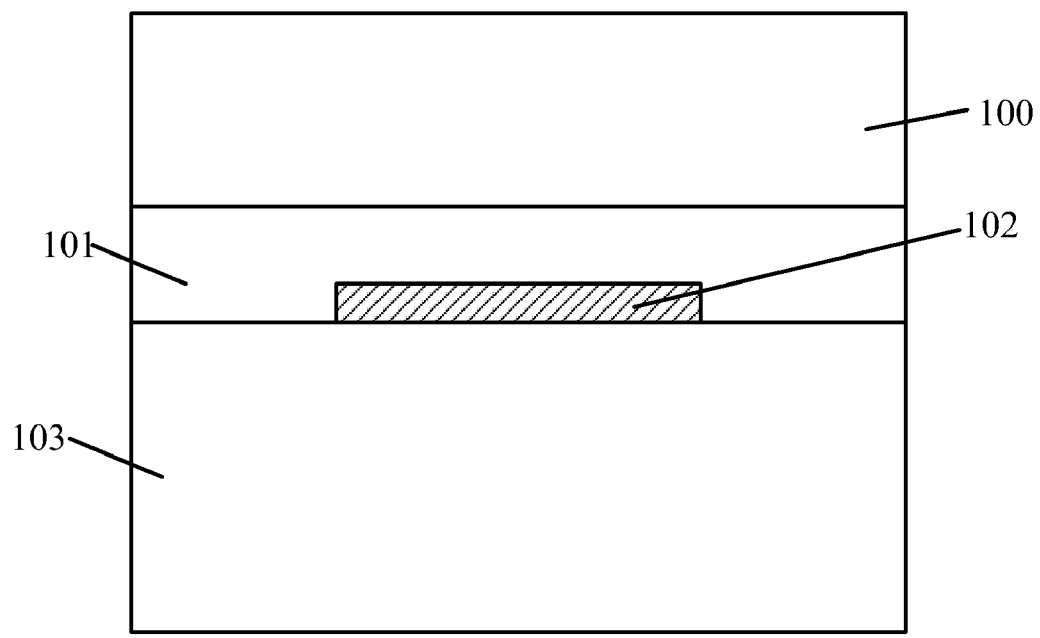
FIG. 6 to FIG. 13 are schematic cross-sectional views illustrating intermediate structures of the method in FIG. 5.

FIG. 6 shows a first substrate 100 and a second substrate 103 that are bonded to each other. A posterior interconnect layer 101 is formed between the first substrate 100 and the second substrate 103, and a weld pad 102 is formed in the posterior interconnect layer 101.

In an embodiment, the weld pad 102 is located in a portion of the posterior interconnect layer 101 close to the first substrate 100. However, in other embodiments, the weld pad 102 may be located in a portion of the posterior interconnect layer 101 close to the second substrate 103, as shown in FIG. 6.

The first substrate 100 generally includes a semiconductor material such as silicon, germanium, or silicon on insulator.

A component layer (not shown) is formed on the first substrate 100, and a semiconductor component is formed in the component layer, wherein the semiconductor component may include a transistor, a diode, a resistor, and the like.

The posterior interconnect layer 101 that may include an electric insulation material is formed below the component layer. The semiconductor component in the component layer is electrically connected with the weld pad 102 by means of metal wires which are formed in the posterior interconnect layer 101. The posterior interconnect layer and the second substrate 103 are bonded together by a permanent bonding process or a temporary bonding process, so that the first substrate 100 and the second substrate 103 are bonded together by the posterior interconnect layer 101. In an embodiment, the weld pad 102 has a thickness ranging from 20 μm to 100 μm.

In an embodiment, the second substrate 103 may include glass. In another embodiment, the second substrate may include a semiconductor material.

Figure 7:
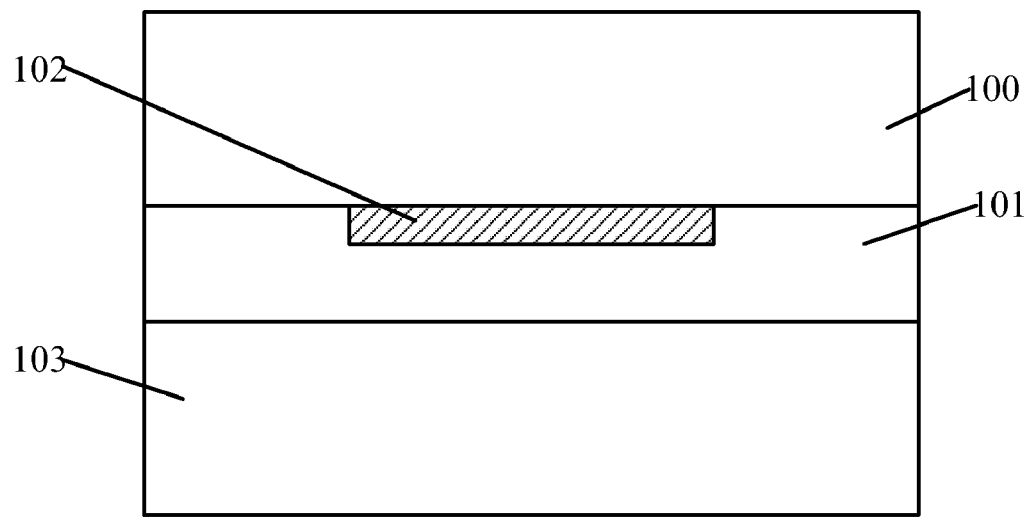

Thereafter, referring to FIG. 7, a thinning process is performed on a surface of the first substrate 100 that is facing away from the second substrate 103, so that a thickness of the first substrate 100 can meet process requirements after the thinning process. In an embodiment, the thickness of the first substrate 100 after the thinning process ranges from 2 μm to 300 μm. The thinning method is well known to those skilled in the art, and is not described in detail herein.

Figure 8:
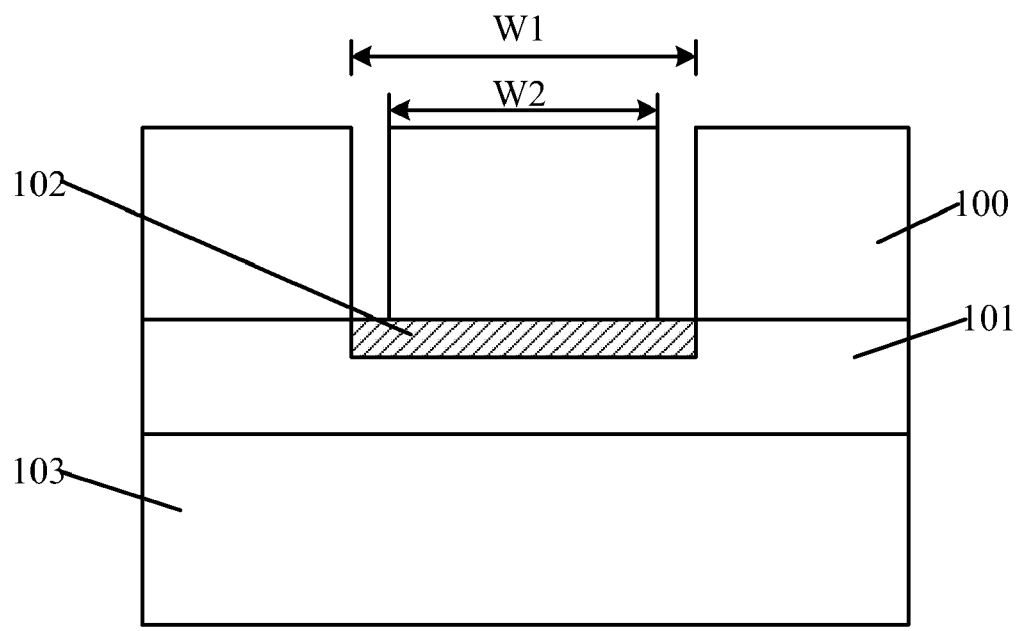

Thereafter, referring to FIG. 8, a first etching process is performed on the surface of the first substrate 100 facing away from the second substrate 103 in the direction toward the second substrate to form a first annular opening. A portion of the weld pad 102 is exposed by the first annular opening, and a portion of the first substrate 100 is surrounded by the first annular opening. In an embodiment, the first etching process may be a plasma etching process or a wet etching process.

Referring still to FIG. 8, a cross-section of the first opening includes an internal circle and an external circle, wherein the external circle W1 has a diameter that is substantially equal a width of the weld pad, and the internal circle w2 has a diameter that is less than the width of the weld pad 102, so that the first opening is located on a peripheral portion of the weld pad 102.

A dielectric layer fills the first opening in a subsequent step. The dielectric layer can be adopted to electrically insulate a metal layer filled in subsequent steps from the first substrate 100, and to prevent the weld pad 102 and the other portion of first substrate which is not surrounded by the first annular opening from being damaged during etching the portion of the first substrate which is surrounded by the first opening.

A portion of the weld pad 102 which is below the first opening may not be used as a weld pad because the portion of the weld pad 102 is covered by the dielectric layer, so that an actual usable area of the weld pad is reduced. To prevent excessive damage to the weld pad 102, the first opening should not have a very wide width. In an embodiment, the width of the first opening is ½ times the difference between the diameter W1 of external circle and the diameter W2 of the internal circle. In an embodiment, the width of the first opening ranges from 0.1 μm to 50 μm and the width of the weld pad 102 ranges from 20 μm to 150 μm.

Figure 14:
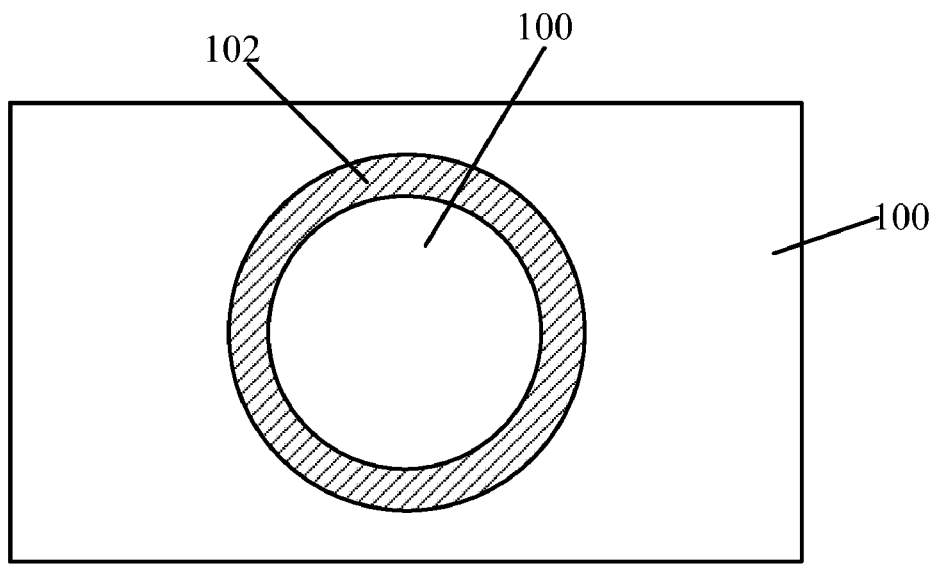
FIG. 14 is a schematic top view of FIG. 8.

FIG. 14 is a schematic top view of FIG. 8 showing the portion of the first substrate 100 which is surrounded by the first opening and the portion of the weld pad 102 which is exposed through the first opening are shown.

In an embodiment, the peripheral portion of the weld pad 102 is exposed through the first opening and the first opening is annular. In another embodiment, the first opening may have an elliptic shape or a quadrilateral shape.

It should be noted that, if the weld pad 102 is located in a portion of the posterior interconnect layer 101 close to the second substrate 103, the first opening is formed in the first substrate 100 and in the posterior interconnect layer 101 and, accordingly, the first etching process is performed in the first substrate 100 and in the posterior interconnect layer 101, which can ensure that the peripheral portion of the weld pad 102 is exposed through the first opening.

Figure 9:
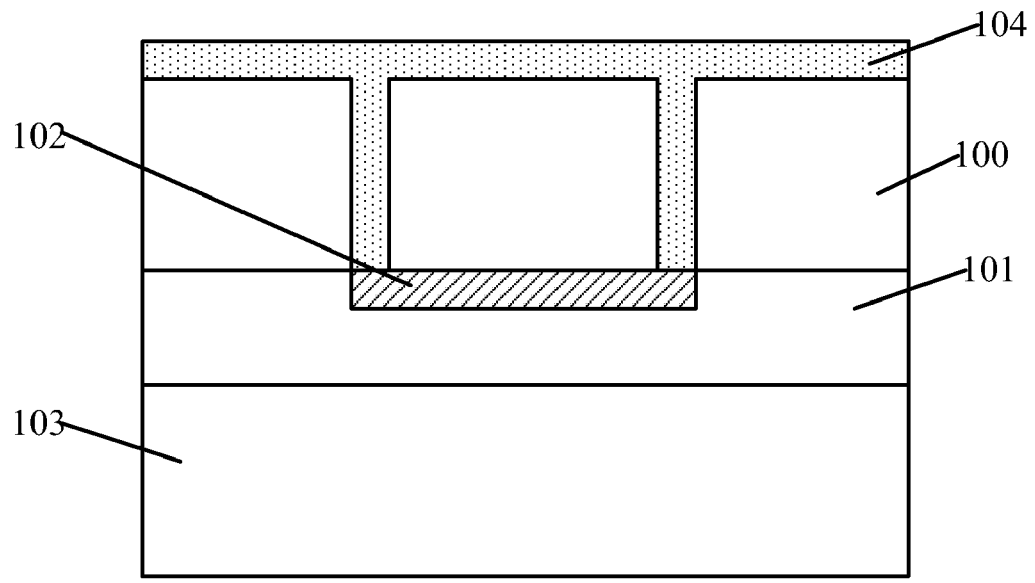

Thereafter, referring to FIG. 9, the dielectric layer 104 is formed in the first opening. In an embodiment, the dielectric layer 104 covers the portion of the first substrate 100 which is not surrounded by the first opening and covers the portion of the first substrate 100 which is surrounded by the first opening. In an embodiment, the dielectric layer has a thickness ranging from 0.5 μm to 5 μm.

The portion of the first substrate 100 which is surrounded by the first annular opening will be removed in a third etching process. In the third etching process, the dielectric layer 104 functions as a protective layer to prevent the portion of the first substrate 100 which is not surrounded by the first opening from being etched. The dielectric layer 104 includes a material which has an etching selectivity ratio of the first substrate 100 to the weld pad 102. In an embodiment, the dielectric layer 104 includes an electric insulation material, such as silicon oxide, silicon nitride, silicon carbide and silicon oxynitride. In an embodiment, the electric insulation material may include pure silicon oxide or doped silicon oxide, such as boron silicon oxide, phosphorus silicon oxide, or boron phosphorus silicon oxide.

Figure 10:
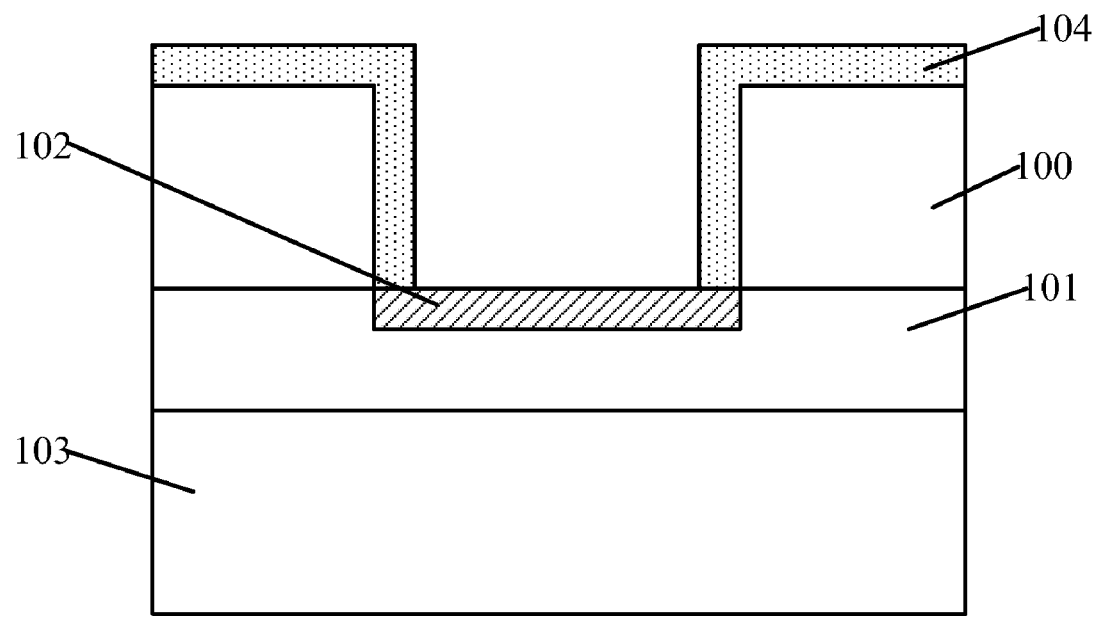

Thereafter, referring to FIG. 10, the portion of the dielectric layer 104 which covers the portion of the first substrate 100 surrounded by the first opening is removed by a second etching process to expose the portion of the first substrate 100 surrounded by the first opening, wherein the second etching process may be a dry or wet etching process.

Figure 15:
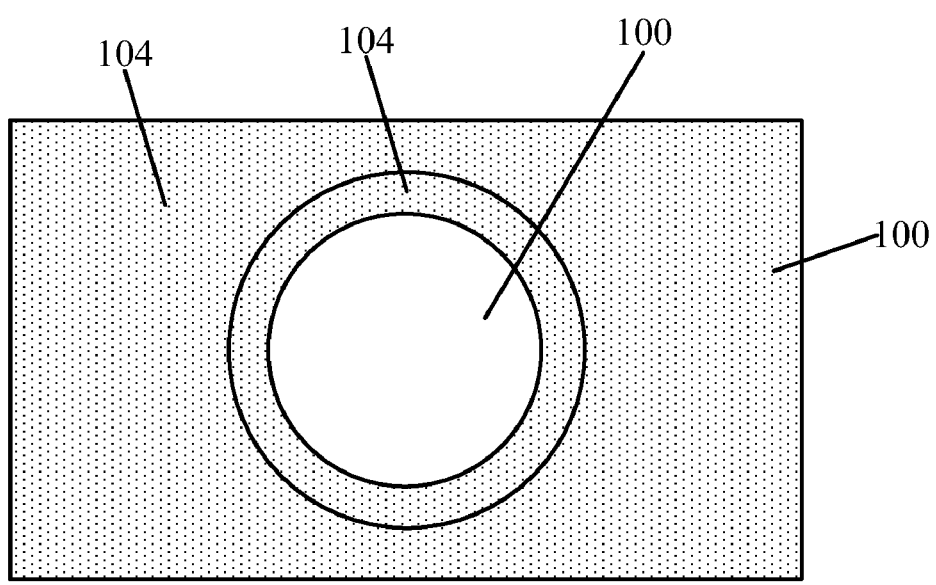
FIG. 15 is a schematic top view of FIG. 10.

FIG. 15 is a schematic top view of FIG. 10 showing the portion of the first substrate 100 that is surrounded by the first opening.

In the second etching process, the portion of the dielectric layer 104 which covers the portion of the first substrate 100 surrounded by the first opening is removed, and a mask layer is formed on the first substrate 100 to expose the portion of the dielectric layer 104 which covers the portion of the first substrate 100 surrounded by the first opening. The second etching process which may be a dry or wet etching process is performed to remove the portion of the dielectric layer 104 exposed by the mask layer for forming a structure which is shown in FIG. 15 and FIG. 10. In addition, the mask layer which may include a photoresist layer or a hard mask layer also should be removed at the end of the second etching process.

Figure 11:
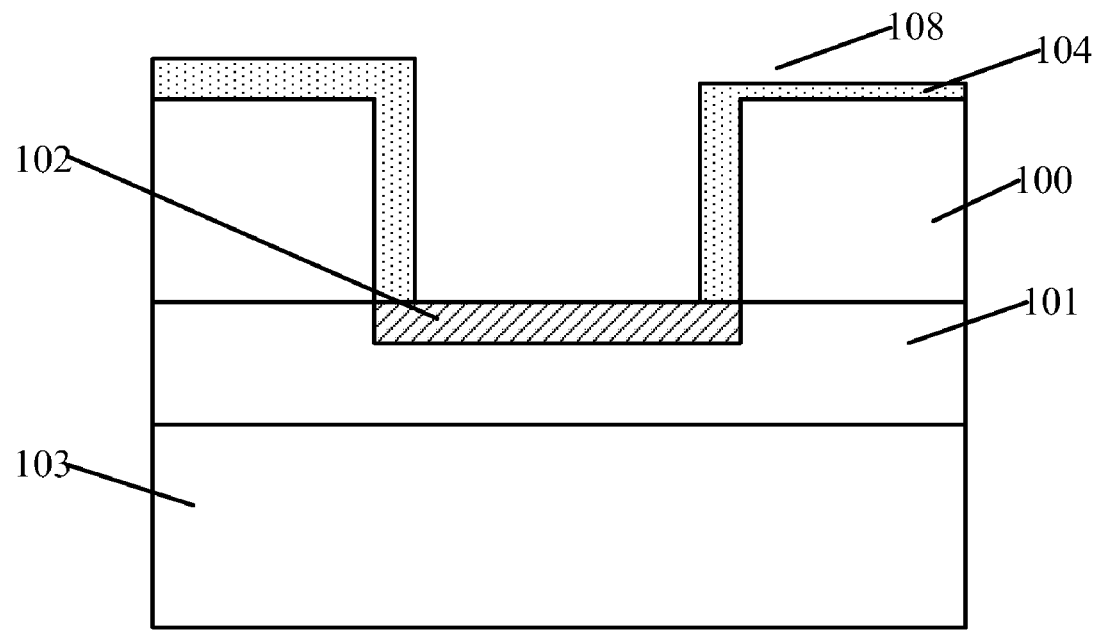

Thereafter, referring to FIG. 11, the portion of the first substrate 100 which is surrounded by the first opening is removed to form a via for exposing the weld pad 102 by the third wet etching process. The third wet etching process has an etching selectivity ratio of the first substrate 100 to the dielectric layer 104 which is greater than 10:1 and an acidic etching solution which includes a mixture of hydrofluoric acid and nitric acid is used in the third etching process.

Compared to the plasma etching process in the prior art, the third wet etching process adopted to remove the via can achieve better uniformity and have etching selectivity ratio of the first substrate 100 to the dielectric layer 104 greater than 10:1, so that the portion of the first substrate 100 which is surrounded by the first opening and oxide can be removed without causing damage to the weld pad 102 and the dielectric layer 104 in the third etching process.

Before the third wet etching process, another mask layer is formed on the first substrate 100 and on the dielectric layer 104 to expose the portion of the first substrate 100 which is surrounded by the first opening. After the third wet etching process, the mask layer which may include a photoresist layer or a hard mask layer is removed.

Thereafter, a fourth etching process is performed on a portion of the dielectric layer 104 which is on a side of the via to form a second opening 108 which is connected with via.

Figure 16:
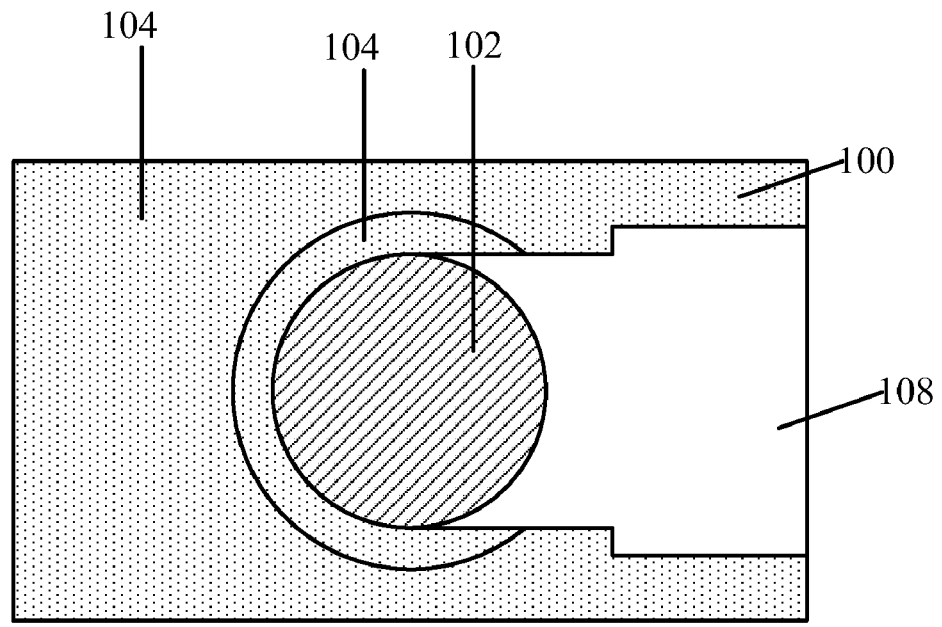
FIG. 16 is a schematic top view of FIG. 11.

Referring to FIG. 16 which is a schematic top view of FIG. 11, the second opening 108 is connected with the via. In addition, the second opening 108 and the via will be filled with a metallic material to form an interconnect layer in subsequent steps.

The fourth etching process adopted to form the second opening 108 may be a wet etching process or a dry etching process. In an embodiment, the second opening 108 and the via are formed in the same wet etching process, so that manufacturing steps can be reduced. However, in another embodiment, the second opening 108 may be formed in an exclusive wet etching process or an exclusive dry etching process. In yet another embodiment, the second opening 108 has a depth that is about ⅕ to ¾ times that of the dielectric layer before the fourth wet etching process.

Figure 12:
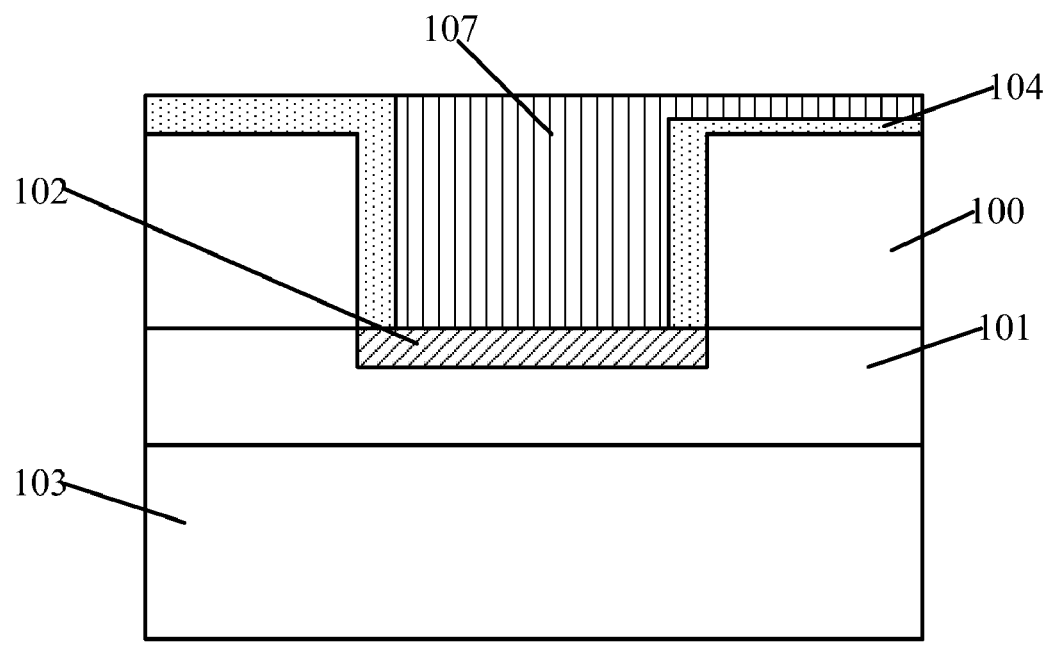

Thereafter, referring to FIG. 12, a metallic material is filled in the via and the second opening 108 to form an interconnect layer 107, wherein the metallic material may include gold, silver, titanium, wolfram, or aluminum in an embodiment. In a specific embodiment, the interconnect layer 107 may include copper and may be formed by an electroplating process.

After the interconnect layer 107 is formed, a planarization process is performed so that the interconnect layer 107 is substantially flush (coplanar) with a surface of the dielectric layer 104 which is on the opposite side of the via, wherein the planarization process may be a chemical mechanical planarization process.

Figure 17:
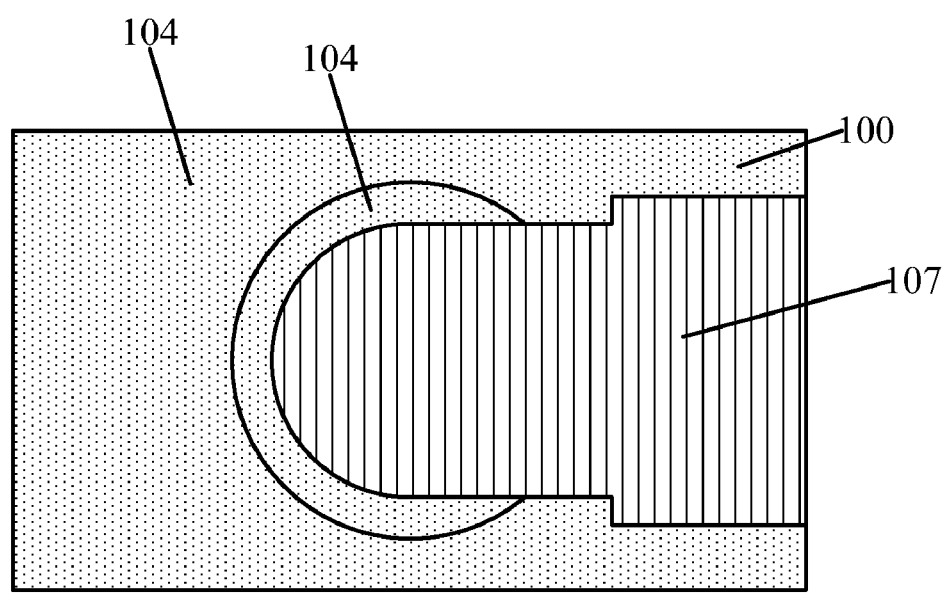
FIG. 17 is a schematic top view of FIG. 12.

FIG. 17 is a schematic top view of FIG. 12 showing the via and the second opening 108 that are filled with the interconnect layer 107.

It should be noted that, the interconnect layer 107 can also be formed on the dielectric layer and in the via. Accordingly, it's not necessary to form the second opening in the third wet etching process in which the via is formed.

Figure 13:
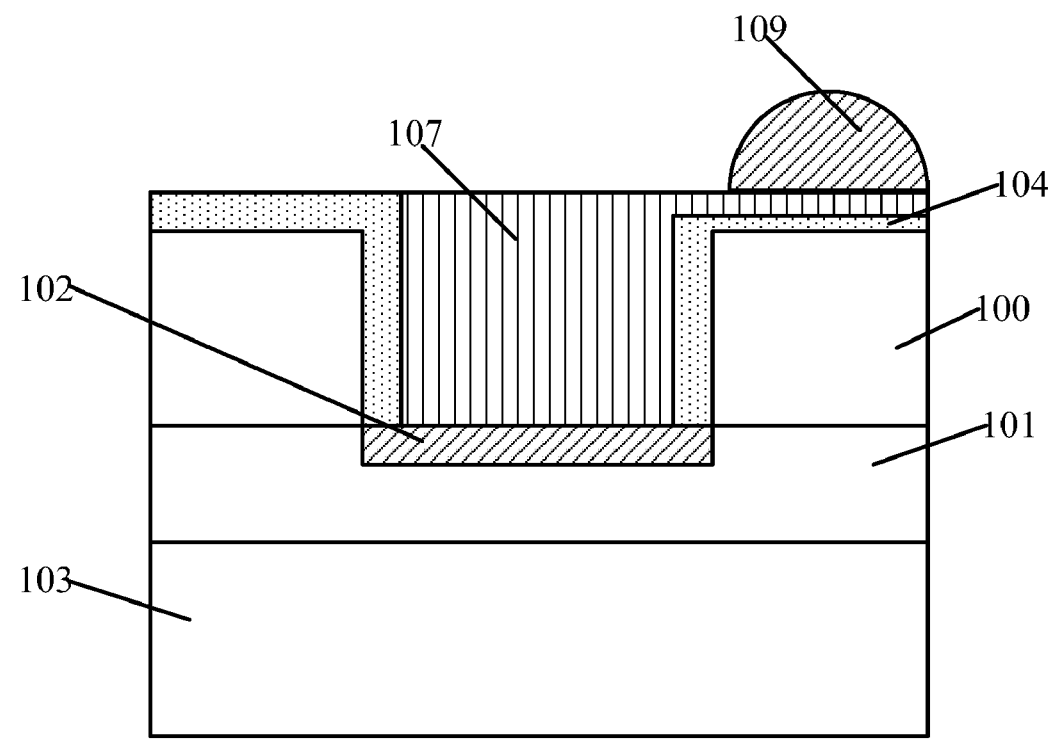

Thereafter, referring to FIG. 13, a conductive bump 109 is formed on the interconnect layer 107 using a conventional method of forming the conductive bump 109. The conventional method of forming bump is well known to those skilled in the art and is therefore not described herein for the sake of brevity.

Figure 18:
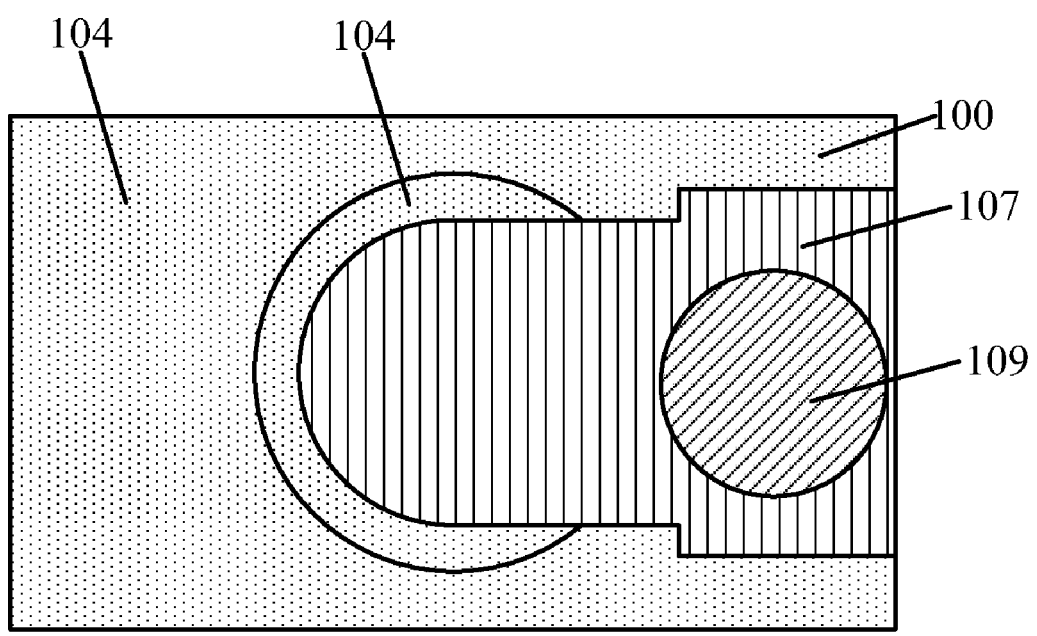
FIG. 18 is a schematic top view of FIG. 13.

FIG. 18 is a schematic top view of FIG. 13 showing the conductive bump 109 formed on the interconnect layer 107. Generally, after the conductive bump 109 is formed, a plastic packaging process may be performed. The packaging process may include a plastic packaging process or a ceramic packaging process, which is well known to those skilled in the art, and is not described herein.

As shown in FIG. 13, the semiconductor structure formed by the steps described above includes a first substrate 100 and a second substrate 103 that are bond to each other, a posterior interconnect layer 101 is formed between the first substrate 100 and the second substrate 103, a weld pad 102 is formed in the posterior interconnect layer 101, a component layer is formed on the first substrate 100, a semiconductor component is formed in the component layer, the posterior interconnect layer 101 is located below the component layer, and the semiconductor component in the component layer is electrically connected with the weld pad 102 by means of metal wires formed in the posterior interconnect layer 101. The semiconductor structure also includes a via disposed in the first substrate 100, wherein the via has a top surface that is substantially flush (coplanar) with a surface of the first substrate 100, a dielectric layer 104 formed on a surface of the first substrate 100 and on sidewalls of the via, wherein a portion of the dielectric layer 104 disposed on the a sidewall of the via has a thickness that is different from a thickness of the other portion of the dielectric layer 104 located on the opposite sidewall of the via, a second opening is formed in a portion of the dielectric layer which is on a side of the via, and the second opening is connected with the via. The semiconductor structure further includes an interconnect layer 107 formed in the via and the second opening, and a conductive bump 109 disposed on the interconnect layer 107, wherein the conductive bump 109 is electrically connected with the weld pad 102 through the interconnect layer 107.

In a specific embodiment, a location of the first annular opening determines a location of the weld pad 102. In another embodiment, if the weld pad 102 is located in the portion of the posterior interconnect layer 101 which is close to the second substrate 103, the first opening will be located in the first substrate 100 and in the posterior interconnect layer 101.

In another embodiment, the thickness of the portion of the dielectric layer 104 located on the a sidewall of the via may be the same as the thickness of the portion of the dielectric layer 104 located on the other side wall of the via, the second opening in the dielectric layer 104 is not necessary, and the interconnect layer 107 may be formed in the via and on the surface of the dielectric layer 104.

In conclusion, embodiments of the present invention disclose that a first annular opening in a first substrate or in a first substrate and a posterior interconnect layer is formed to expose at least a portion of a weld pad, then a dielectric layer is formed in the first opening, wherein the first opening is filled with the dielectric layer. Thereafter, a wet etching process is performed to remove a portion of the first substrate for forming a via using the dielectric layer as a mask, wherein the portion of first substrate is surrounded by the first opening and the weld pad is exposed through the via. Therefore, compared with a plasma etching process which is adopted to etch the first substrate for forming the via in the prior art, a wet etching process in the embodiment of the present invention causes less damage to the weld pad. And embodiments of the present invention can enhance uniformity of the via and improve stability of manufacturing processes. Furthermore, there are greater uniformity of the interconnect layer and fewer damages to the weld pad in the embodiment of the present invention so that semiconductor devices thus formed and 3D packages of a semiconductor devices have higher reliability that provides production efficiency enhancement and production cost reduction.

Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claims.

What is claimed is:

1. A method for manufacturing a semiconductor device, the method comprising:
   providing a first substrate and a second substrate, the first substrate and the second substrate being bonded to each other and having a posterior interconnect layer interposed between them, and a weld pad disposed in the posterior interconnect layer;
   forming a first annular opening in the first substrate to expose a portion of the weld pad;

forming a dielectric layer in the first annular opening;

removing a portion of the first substrate that is surrounded by the first annular opening by a wet etching process and using the dielectric layer as a mask to form a via that exposes at least a portion of the weld pad;

forming an interconnect layer in the via, the interconnect layer being electrically connected with the weld pad; and forming a conductive bump on the interconnect layer, wherein the conductive bump is electrically connected with the interconnect layer.

2. The method according to claim 1, wherein the wet etching process comprises an etching selectivity ratio of the first substrate to the dielectric layer that is greater than 10:1 and an acidic etching solution.

3. The method according to claim 2, wherein the etching solution comprises a mixture including hydrofluoric acid and nitric acid.

4. The method according to claim 1, wherein the dielectric layer comprises an electric insulation material including silicon oxide or doped silicon oxide.

5. The method according to claim 4, wherein the dielectric layer comprises a thickness ranging from 0.5 µm to 5 µm.

6. The method according to claim 1, wherein the first opening comprises a width ranging from 0.1 µm to 50 µm.

7. The method according to claim 1 further comprising, before forming the first opening, performing a thinning process on a surface of the first substrate that is facing away from the second substrate, wherein the first substrate comprises a thickness ranging from 2 µm to 300 µm after the thinning process.

8. The method according to claim 1, wherein the weld pad is disposed in a portion of the posterior interconnect layer close to the first substrate, and the first annular opening is formed by etching the first substrate.

9. The method according to claim 1, wherein the weld pad is disposed in a portion of the posterior interconnect layer close to the second substrate, and the first annular opening is formed by etching the first substrate and a portion of the posterior interconnect layer.

10. The method according to claim 1, wherein forming the interconnect layer comprises:

etching a portion of the dielectric layer disposed at one side of the via to form a second opening, wherein the second opening is connected with the via; and filling a metal material into the second opening and the via to form the interconnect layer, wherein the interconnect layer is substantially flush with the dielectric layer disposed on an opposite side of the via.

* * * * *